US010079151B2

(12) United States Patent
Tapily et al.

(10) Patent No.: US 10,079,151 B2
(45) Date of Patent: Sep. 18, 2018

(54) METHOD FOR BOTTOM-UP DEPOSITION OF A FILM IN A RECESSED FEATURE

(71) Applicant: Tokyo Electron Limited, Tokyo (JP)

(72) Inventors: Kandabara N Tapily, Mechanicville, NY (US); David L O'Meara, Albany, NY (US); Kaushik A Kumar, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/273,124

(22) Filed: Sep. 22, 2016

(65) Prior Publication Data

US 2017/0092508 A1   Mar. 30, 2017

Related U.S. Application Data

(60) Provisional application No. 62/232,027, filed on Sep. 24, 2015.

(51) Int. Cl.
*H01L 21/311* (2006.01)
*H01L 21/306* (2006.01)
(Continued)

(52) U.S. Cl.
CPC .... *H01L 21/30604* (2013.01); *H01L 21/0257* (2013.01); *H01L 21/3085* (2013.01); *H01L 21/3115* (2013.01); *H01L 21/31116* (2013.01); *H01L 21/31144* (2013.01); *H01L 21/32135* (2013.01); *H01L 21/32139* (2013.01); *H01L 21/76877* (2013.01)

(58) Field of Classification Search
CPC .......... H01L 21/30604; H01L 21/0257; H01L 21/3085; H01L 21/32135; H01L 21/3115; H01L 21/31155

USPC ........ 438/700, 702, 703, 723, 724, 743, 744
See application file for complete search history.

(56) References Cited

U.S. PATENT DOCUMENTS 7,148,155 B1    12/2006  Tarafdar et al.
2005/0112839 A1*  5/2005  Wu ................... H01L 21/26533
                                                         438/389

(Continued)

FOREIGN PATENT DOCUMENTS

KR    10-0744071    7/2007

OTHER PUBLICATIONS

Korean Intellectual Property Office, International Search Report and Written Opinion for International Application No. PCT/US2016/053099, dated Jan. 5, 2017, 12 pages.

(Continued)

*Primary Examiner* — Binh X Tran

(57) ABSTRACT

Embodiments of the invention provide a processing method for bottom-up deposition of a film in a recessed feature. According to one embodiment, the method includes a) providing a substrate containing a recessed feature having a bottom and a sidewall, b) depositing a film on the bottom and on the sidewall of the recessed feature, and c) covering the film at the bottom of the recessed feature with a mask layer. The method further includes d) etching the film from the sidewall, and e) removing the mask layer to expose the film at the bottom of the recessed feature. Steps b)-e) may be repeated at least once until the film at the bottom of the recessed feature has a desired thickness. In one example, the recessed feature may be filled with the film.

16 Claims, 13 Drawing Sheets

(51) Int. Cl.
*H01L 21/02* (2006.01)
*H01L 21/3115* (2006.01)
*H01L 21/308* (2006.01)
*H01L 21/768* (2006.01)
*H01L 21/3213* (2006.01)

(56) References Cited

U.S. PATENT DOCUMENTS

| | | |
|---|---|---|
| 2005/0272201 A1 | 12/2005 | Kangguo et al. |
| 2009/0302380 A1* | 12/2009 | Graf ............... H01L 21/743 257/330 |
| 2013/0230987 A1 | 9/2013 | Draeger et al. |
| 2014/0187019 A1* | 7/2014 | Parthasarathy ....... H01L 29/407 438/430 |
| 2014/0193979 A1 | 7/2014 | Or et al. |
| 2015/0132951 A1 | 5/2015 | Ma et al. |
| 2015/0137269 A1 | 5/2015 | Li et al. |
| 2015/0236142 A1* | 8/2015 | Laven ............... H01L 21/2254 257/66 |

OTHER PUBLICATIONS

Taiwanese IPO, Rejection Decision for Taiwanese Patent Application No. 105130711, dated Jan. 5, 2018, 5 pages.
Taiwanese IPO, Notification of Examination Opinions for Taiwanese Patent Application No. 105130711, dated Jul. 19, 2017, 13 pages.

* cited by examiner

METHOD FOR BOTTOM-UP DEPOSITION OF A FILM IN A RECESSED FEATURE

CROSS-REFERENCE TO RELATED APPLICATIONS

This application is related to and claims priority to U.S. Provisional Patent Application Ser. No. 62/232,027 filed on Sep. 24, 2015, the entire contents of which are herein incorporated by reference.

FIELD OF INVENTION

The present invention relates to the field of semiconductor manufacturing and semiconductor devices, and more particularly, to a method for bottom-up deposition of a film in a recessed feature.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after EUV introduction. Patterning options that enable reduced variability, extend scaling and enhanced CD and process control are needed. Selective deposition of thin films is a key step in patterning in highly scaled technology nodes.

SUMMARY OF THE INVENTION

According to one embodiment, a processed method is disclosed. The method includes a) providing a substrate containing a recessed feature having a bottom and a sidewall, b) depositing a film on the bottom and on the sidewall of the recessed feature, and c) covering the film at the bottom of the recessed feature with a mask layer. The method further includes d) etching the film from the sidewall, and e) removing the mask layer to expose the film at the bottom of the recessed feature. Steps b)-e) may be repeated at least once until the film at the bottom of the recessed feature has a desired thickness. In one example, the recessed feature may be filled with the film.

According to another embodiment, the processing method includes a) providing a substrate containing a recessed feature having a bottom and a sidewall, b) depositing a film on the bottom and on the sidewall of the recessed feature, c) treating the film with a gas phase plasma to activate the film on the sidewall for faster etching than the film on the bottom of the recessed feature, and d) selectively etching the treated film from the sidewall. In one embodiment, the method further includes repeating steps b)-d) at least once until the film at the bottom of the recessed feature has a desired thickness. In one example, the recessed feature may be filled with the film.

According to another embodiment, the processing method includes a) providing a substrate containing a recessed feature having a bottom and a sidewall, b) depositing a film on the bottom and on the sidewall of the recessed feature, and c) covering the film at the bottom of the recessed feature with a mask layer. The method further includes d) depositing a dopant film containing dopants in recessed feature, e) annealing the substrate to diffuse the dopants from the dopant film into the first film on the sidewall to activate the film on the sidewall for faster etching than the film on the bottom of the recessed feature, f) etching the dopant film and the film from the sidewall, and g) removing the dopant film and the mask layer from the film at the bottom of the recessed feature. In one embodiment, the method further includes repeating steps b)-g) at least once until the film at the bottom of the recessed feature has a desired thickness. In one example, the recessed feature may be filled with the film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention provide a method for bottom-up deposition of a film in a recessed feature.

Figure 1:
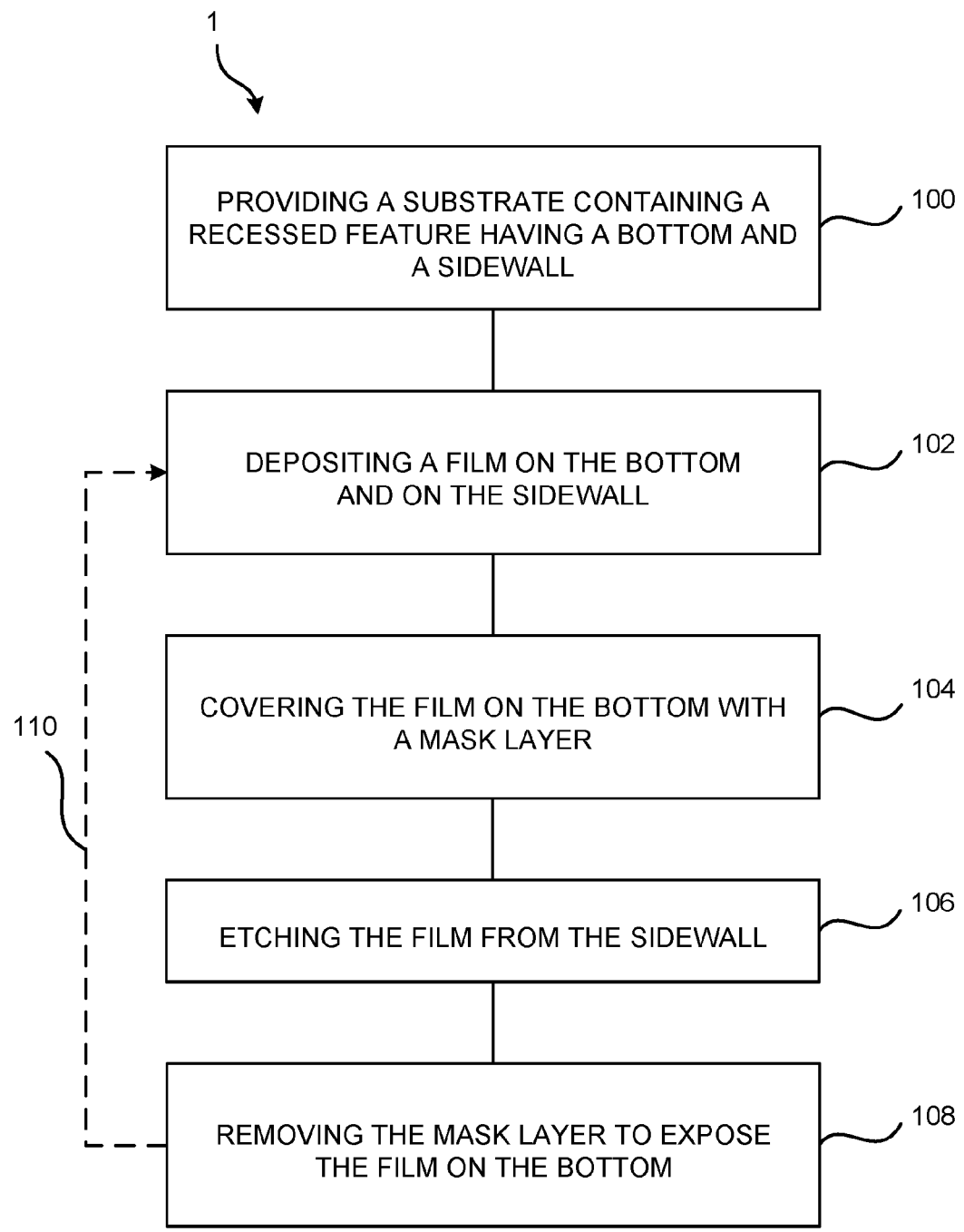
FIG. 1 is a process flow diagram for processing a substrate according to an embodiment of the invention.

FIG. 1 is a process flow diagram for processing a substrate according to an embodiment of the invention, and FIGS. 2A-2F schematically show through cross-sectional views a method of processing a substrate according to an embodiment of the invention.

Figure 2A:
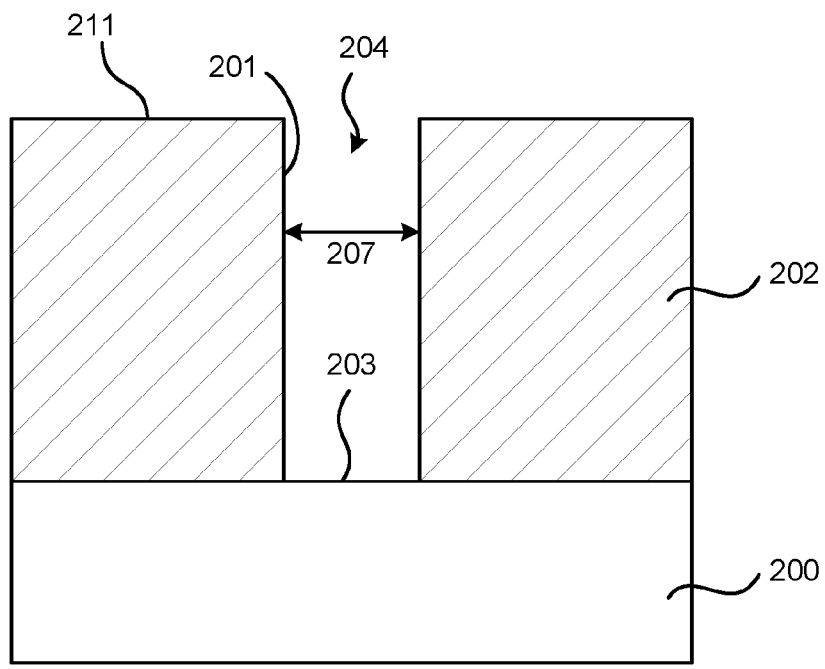
FIGS. 2A-2F schematically show through cross-sectional views a method of processing a substrate according to an embodiment of the invention.

The process flow 1 includes, in 100, providing a substrate 200 containing a film 202 thereon having a recessed feature 204 with a bottom 203 and a sidewall 201. This is schematically shown in FIG. 2A. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater than 200 nm.

According to one embodiment, the substrate 200 and the film 202, and therefore the bottom 203 and the sidewall 201, may contain the same material. For example, the material of the bottom 203 and the sidewall 201 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

According to another embodiment, the substrate 200 and the film 202, and therefore the bottom 203 and the sidewall 201, may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

The recessed feature 204 may be formed using well-known lithography and etching processes. Although not shown in FIG. 2A, a patterned mask layer may be present on the field area 211 and defining the opening of the recessed feature 204.

Figure 2B:
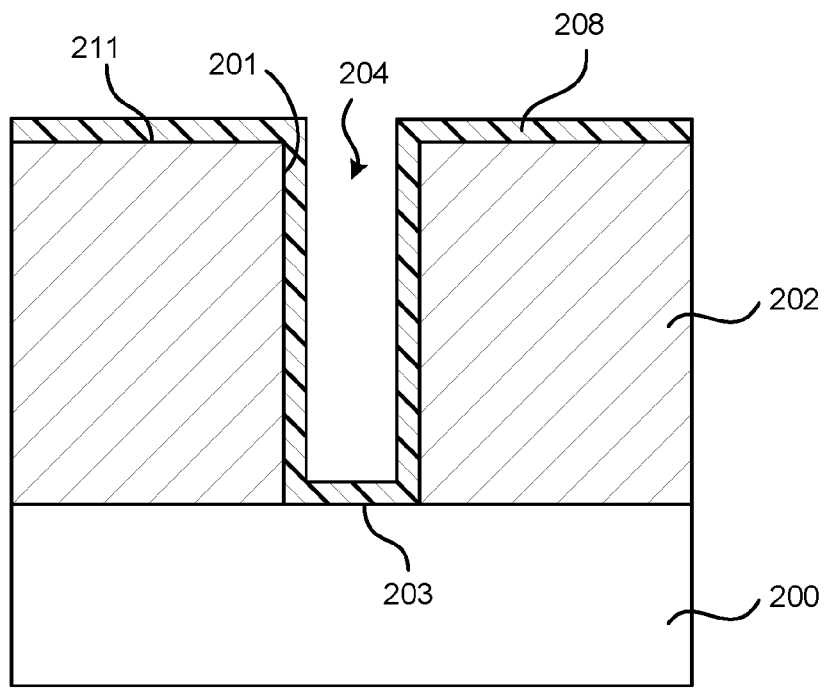

The process flow 1 further includes, in 102, depositing a film 208 on the bottom 203 and on the sidewall 201. This is schematically shown in FIG. 2B. According to one embodiment, the film 208 may be deposited by atomic layer deposition (ALD). ALD can deposit very thin films with atomic level thickness control and excellent conformality over advanced raised and recessed features. In one example, the film 208 may be selected from the group consisting of a dielectric material, a metal, and a metal-containing material.

For example, the material of the film 208 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 208 may be selected from the group consisting of a metal oxide film, a metal nitride film, a metal oxynitride film, a metal silicate film, and a combination thereof. For example, the metal and the metal-containing material may be selected from the group consisting of Cu, Al, Ta, Ru, TaN, TaC, and TaCN.

In one example, the film 208 includes a metal oxide film that is deposited using ALD by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

In some examples, a thickness of the film 208 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 2C:
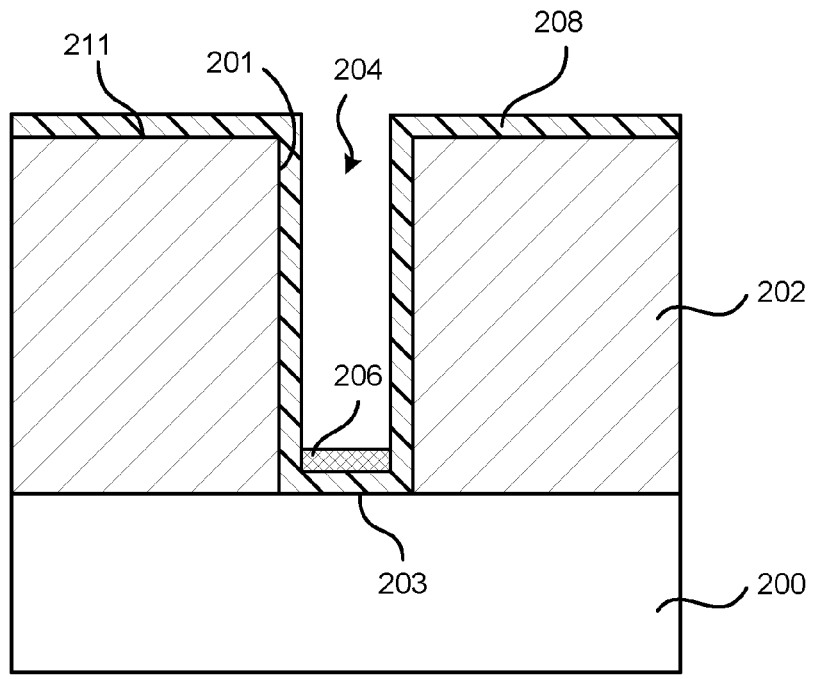

The process flow 1 further includes, in 104, covering the film 208 on the bottom 203 with a mask layer 206. This is schematically shown in FIG. 2C. The mask layer 206 can, for example, contain a photoresist, a hard mask, $SiO_2$, SiN, or a spin-on polymer. In one example, the mask layer 206 may be formed by filling or partially filling the recessed feature 204 with the material of the mask layer 206 and thereafter etching/removing the material from the recessed feature 204 until the mask layer 206 has a desired thickness on the bottom 203.

Figure 2D:
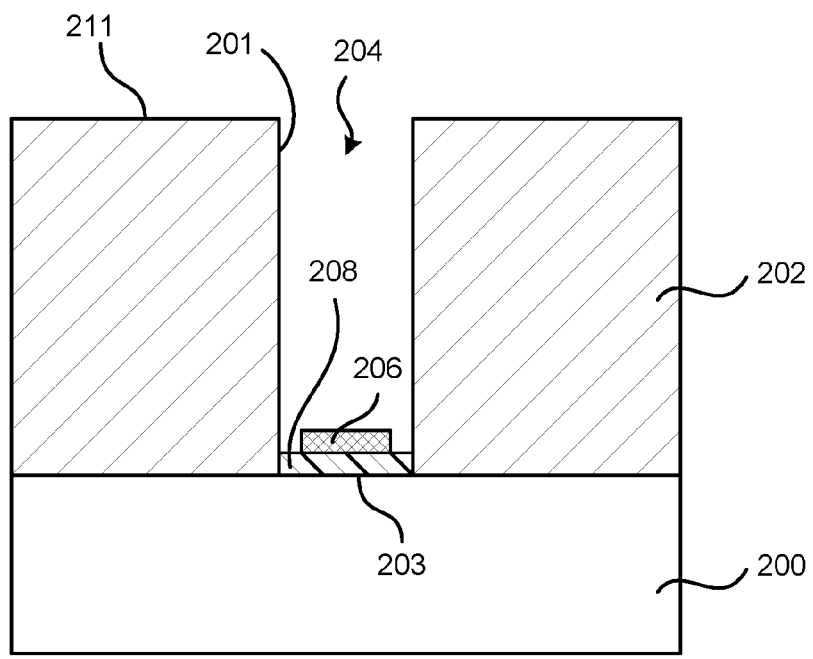
Figure 2E:
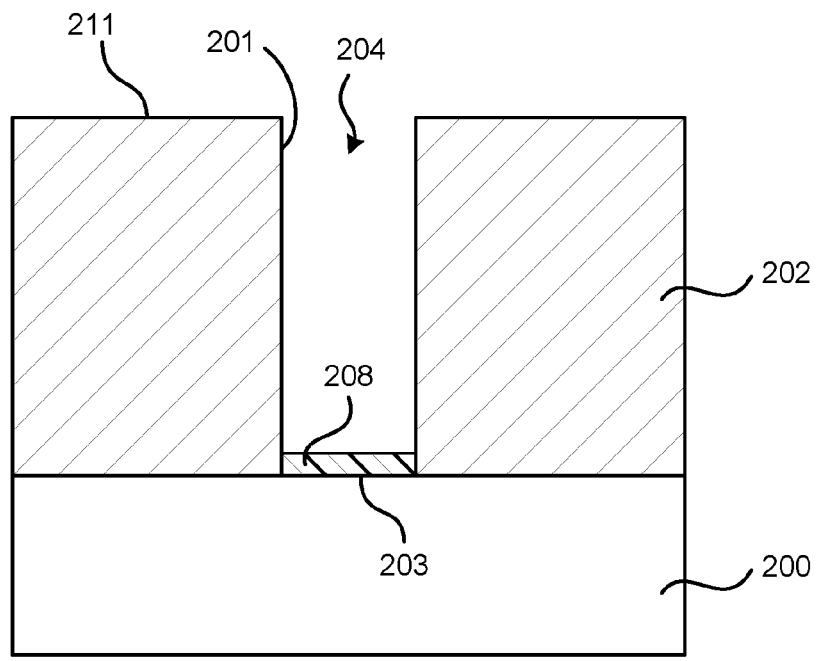

The process flow 1 further includes, in 106, etching the film 208 from the sidewall 201. As depicted in FIG. 2D, the etching removes the film 208 from the sidewall 201 but the mask layer 206 protects the film 208 under the mask layer 206 from etching. The etch gases and the etch conditions may be selected for providing efficient removal of the film 208 that is not protected by the mask layer 206.

The process flow 1 further includes, in 108, removing the mask layer 206 to expose the film 208 on the bottom 203 of the recessed feature 204. The process conditions may be selected for providing efficient removal of the mask layer 206. According to one embodiment, step 106 may be repeated following the step 108 to clean or thin the film 208.

Figure 2F:
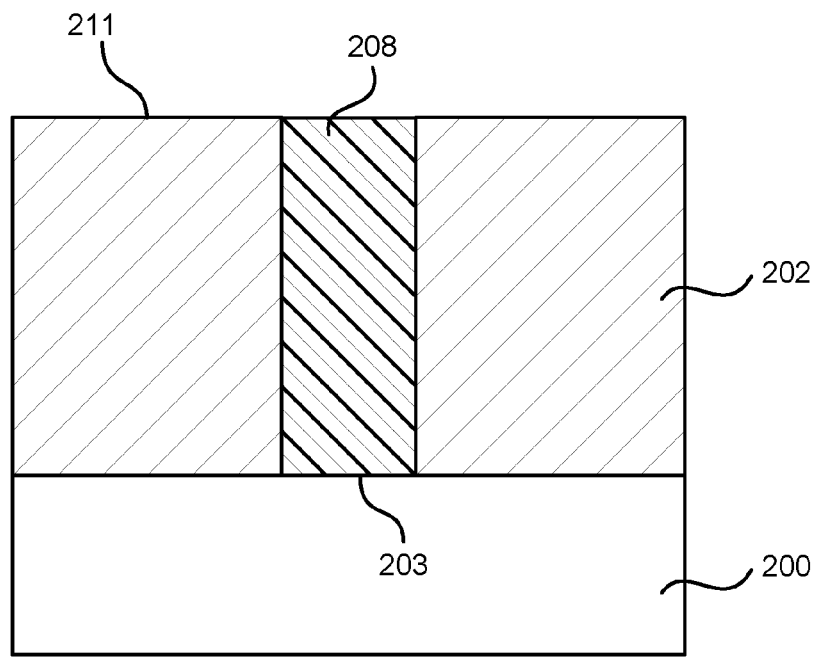

According to one embodiment of the invention, as shown by process arrow 110, steps 102-108 may be repeated until the film 208 has a desired thickness. In one example, as depicted in FIG. 2F, steps 102-108 may be repeated until the recessed feature 204 is filled with the film 208.

Figure 3:
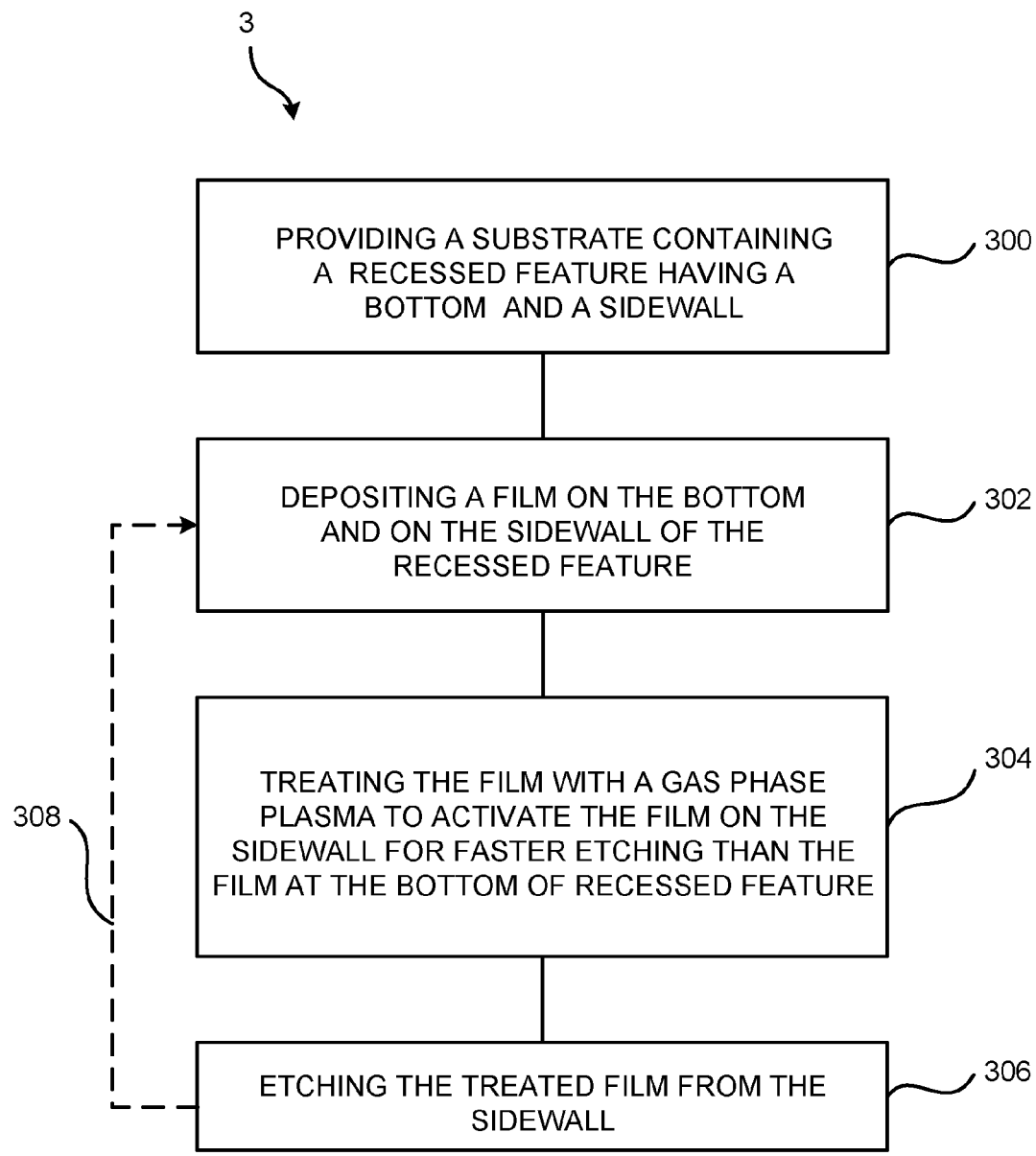
FIG. 3 is process flow diagram for processing a substrate according to an embodiment of the invention.

FIG. 3 is process flow diagram for processing a substrate according to an embodiment of the invention, and FIGS. 4A-4E schematically show through cross-sectional views a method of processing a substrate according to an embodiment of the invention.

The process flow 3 includes in 300, providing a substrate 400 containing a film 402 thereon having a recessed feature 404 with a bottom 403 and a sidewall 401. According to one embodiment, the substrate 400 and the film 402, and therefore the bottom 403 and the sidewall 401, may contain the same material. For example, the material of the bottom 403 and the sidewall 401 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

According to another embodiment, the substrate 400 and the film 402, and therefore the bottom 403 and the sidewall 401, may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, or an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

The recessed feature 404 may be formed using well-known lithography and etching processes. Although not shown in FIG. 4A, a patterned mask layer may be present on the field area 411 and defining the opening of the recessed feature 404.

Figure 4A:
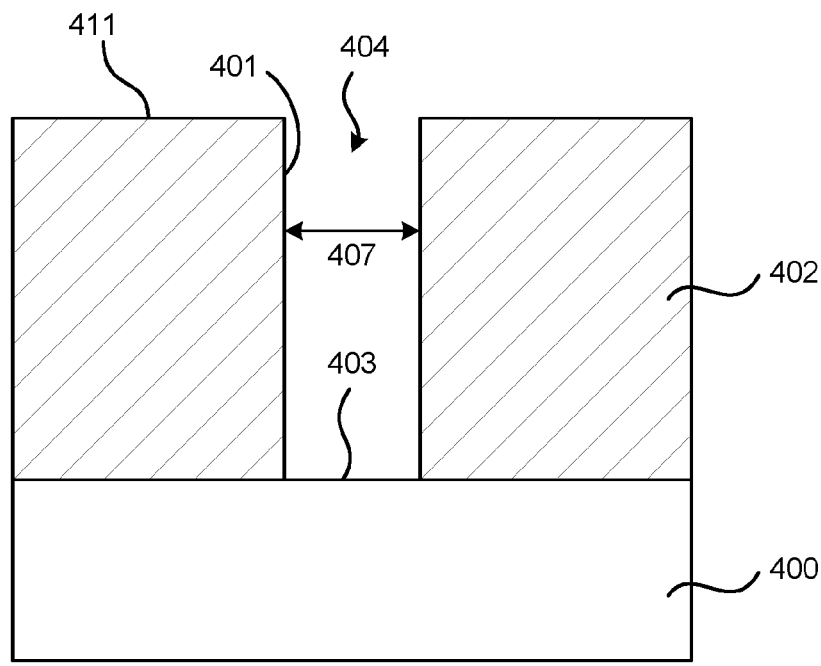
FIGS. 4A-4E schematically show through cross-sectional views a method of processing a substrate according to an embodiment of the invention.
Figure 4B:
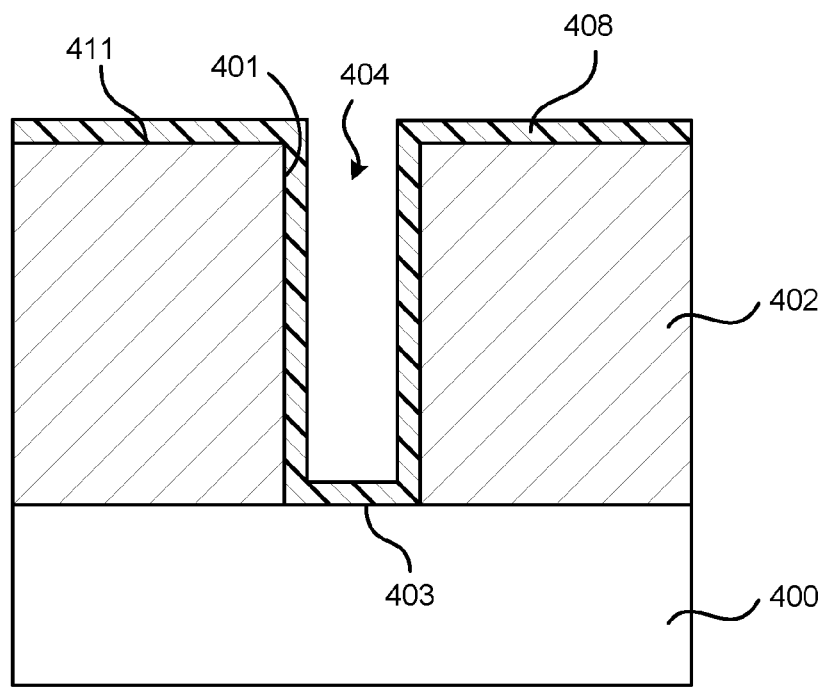

The process flow 3 further includes, in 302, depositing a film 408 on the bottom 403 and on the sidewall 401. This is schematically shown in FIG. 4B. According to one embodiment, the film 408 may be deposited by ALD. In one example, the film 408 may be selected from the group consisting of a dielectric material, a metal, and a metal-containing material.

For example, the material of the film 408 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 408 may be selected from the group consisting of a metal oxide film, a metal nitride film, a metal oxynitride film, a metal silicate film, and a combination thereof. For example, the metal and the metal-containing material may be selected from the group consisting of Cu, Al, Ta, Ru, TaN, TaC, and TaCN.

In one example, the film 408 includes a metal oxide film that is deposited using ALD by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

In some examples, a thickness of the film 408 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 4C:
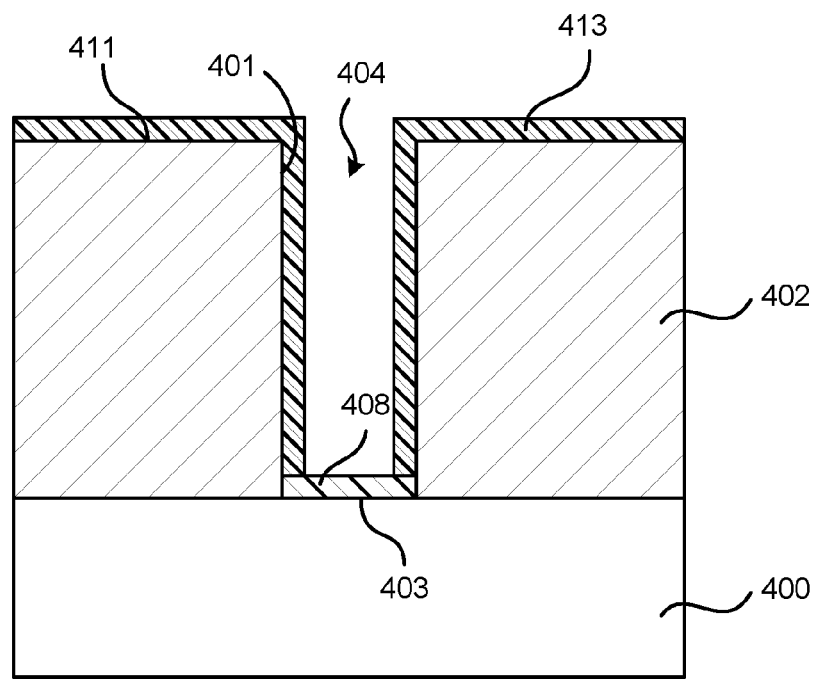

The process flow 3 further includes, in 304, treating the film 408 with a gas phase plasma to activate the film 408 on the field area 411 and the sidewall 401 for faster etching than the film 408 on the bottom 403 of the recessed feature 404. The treated film 413 is schematically shown in FIG. 4C. An isotropic gas phase plasma may be used to treat the film 408 and form the treated film 413. The isotropic characteristics of the gas phase plasma may be selected to preferentially activate the film 408 in the field area 411 and on the sidewall 401 for subsequent selective removal. Plasma activation of the film 408 can include disrupting the crystalline structure of the film 408 by the plasma species, thereby enabling faster etching of the treated film 413 in a subsequent selective etching process. In one example, the gas phase plasma can contain or consist of Ar gas.

Figure 4D:
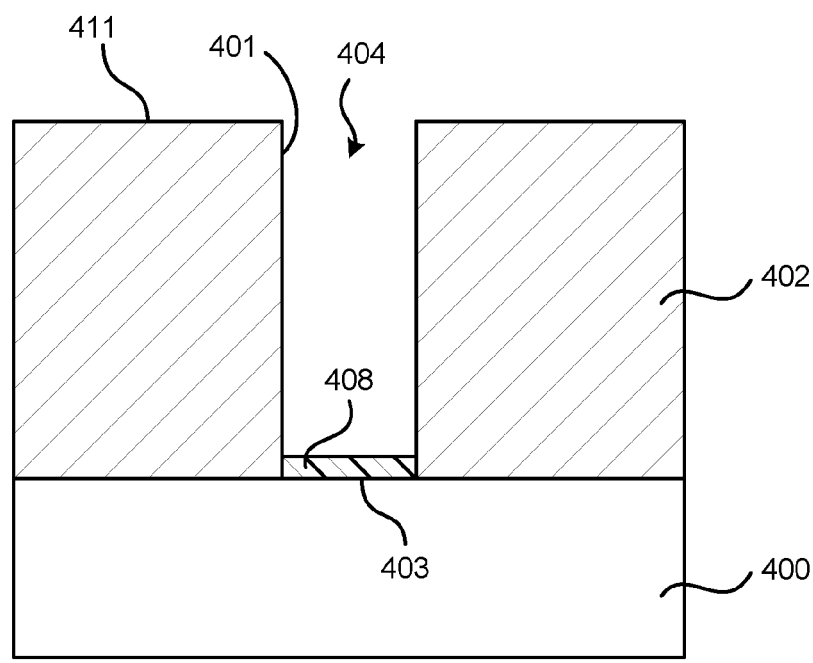

The process flow 3 further includes, in 306, selectively etching the treated film 413 from the sidewall 401 and the field area 411. As depicted in FIG. 4D, the etching selectively removes the treated film 413 from the sidewall 401 and the field area 411 due to the higher etch rate of the treated film 413 on the sidewall 401 and the field area 411 than the film 408 on the bottom 403.

Figure 4E:
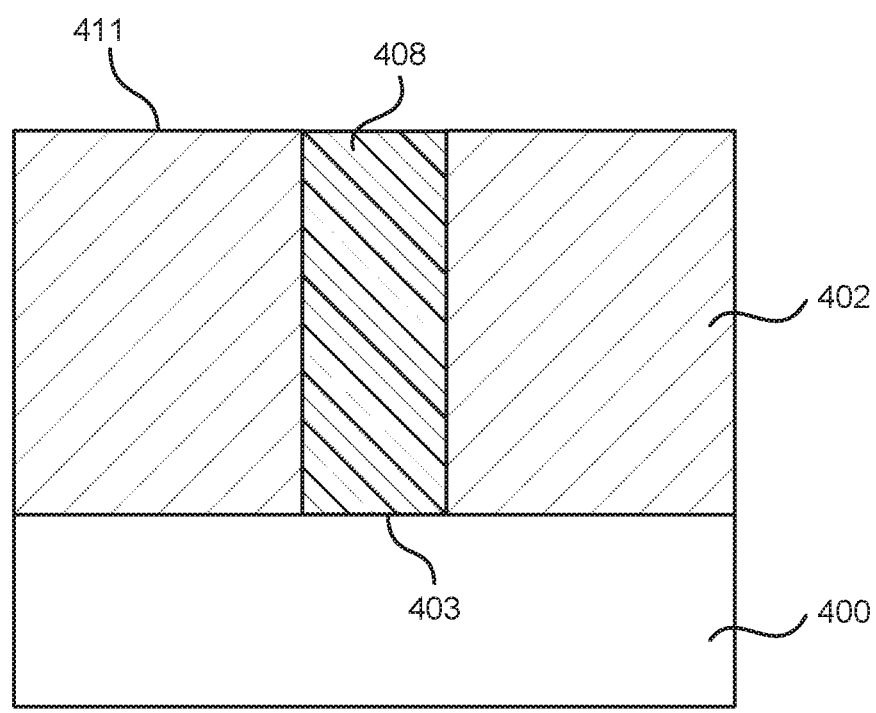

According some embodiments of the invention, as shown by process arrow 308, steps 302-306 may be repeated until the film 408 has a desired thickness. In one example, as depicted in FIG. 4E, steps 302-306 may be repeated until the recessed feature 404 is filled with the film 408.

Figure 5:
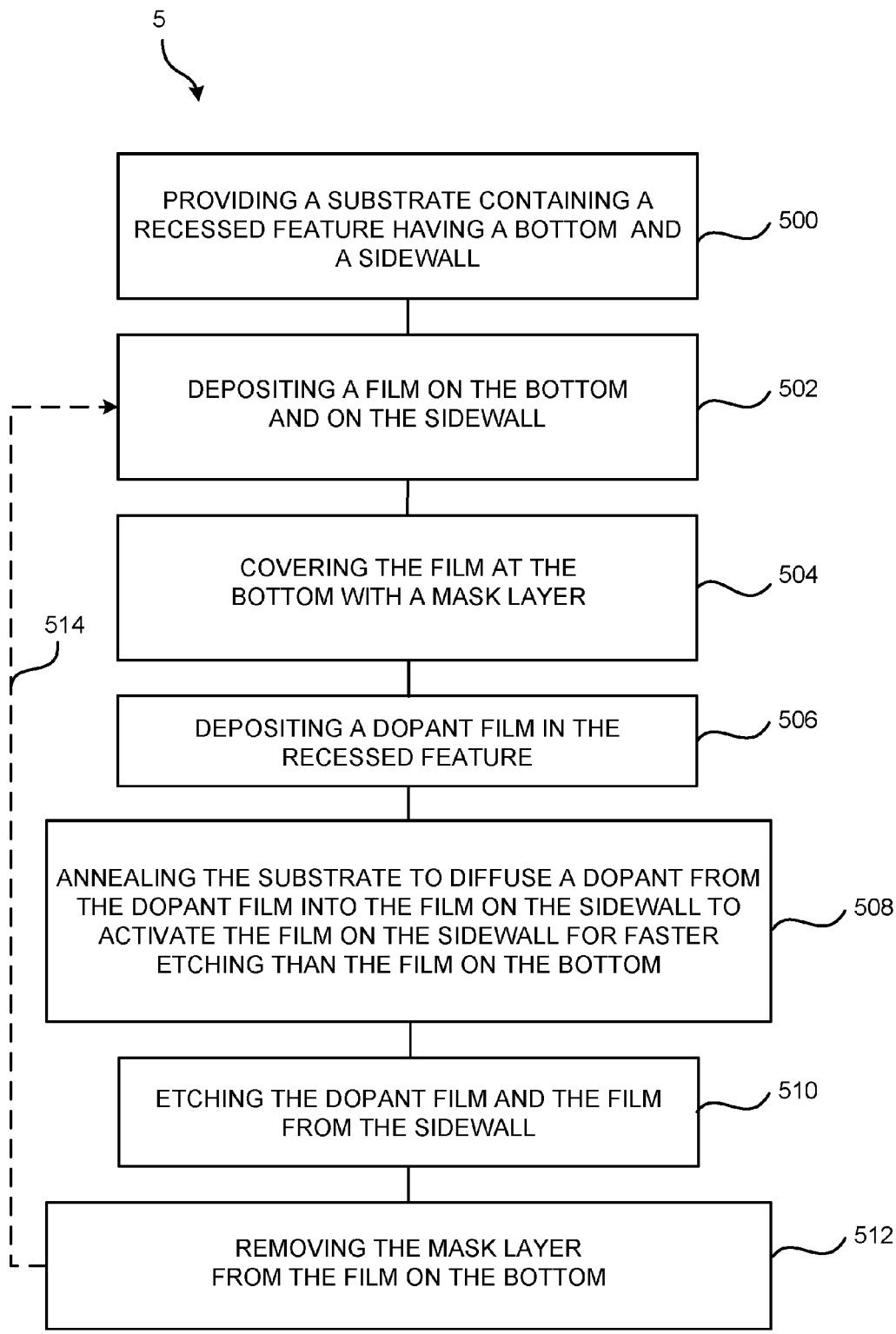
FIG. 5 is process flow diagram for processing a substrate according to an embodiment of the invention.

FIG. 5 is process flow diagram for processing a substrate according to an embodiment of the invention, and FIGS. 6A-6H schematically show through cross-sectional views a method of processing a substrate according to an embodiment of the invention.

The process flow 5 includes, in 500, providing a substrate 600 containing a film 602 thereon having a recessed feature 604 with a bottom 603 and a sidewall 601. According to one embodiment, the substrate 600 and the film 602, and therefore the bottom 603 and the sidewall 601, may contain the same material. For example, the material of the bottom 603 and the sidewall 601 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

According to another embodiment, the substrate 600 and the film 602, and therefore the bottom 603 and the sidewall 601, may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing material may be selected from the group consisting of Cu, Al, Ta, Ru, TaN, TaC, and TaCN.

The recessed feature 604 may be formed using well-known lithography and etching processes. Although not shown in FIG. 6A, a patterned mask layer may be present on the field area 611 and defining the opening of the recessed feature 604.

Figure 6A:
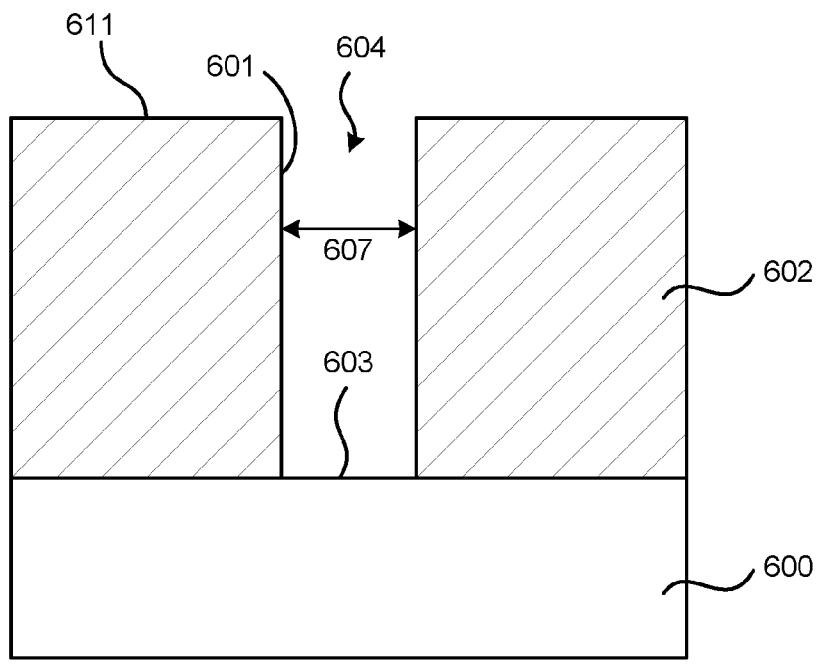
FIGS. 6A-6H schematically show through cross-sectional views a method of processing a substrate according to an embodiment of the invention.
Figure 6B:
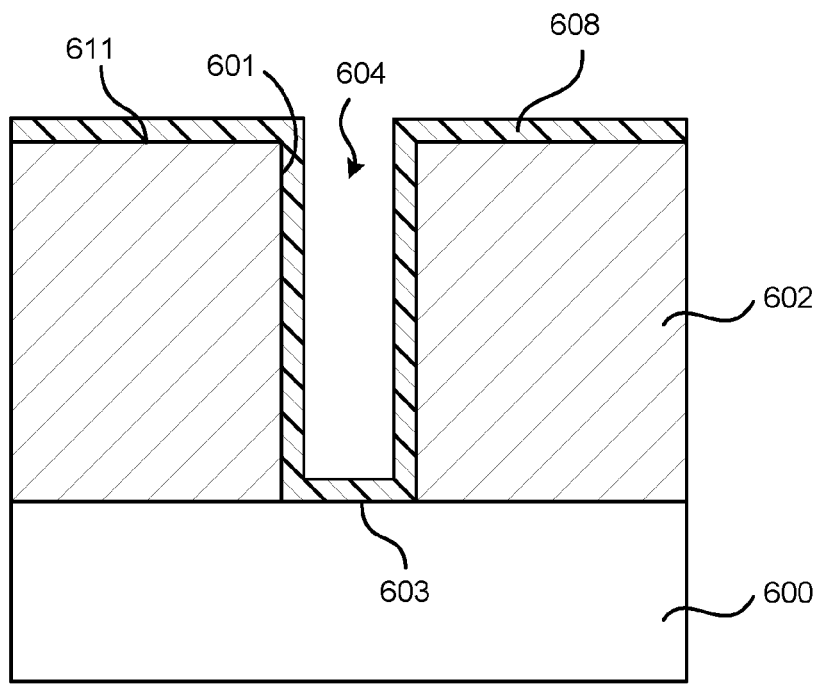

The process flow 5 further includes, in 502, depositing a film 608 on the bottom 603 and on the sidewall 601. This is depicted in FIG. 6B. According to one embodiment, the film 608 may be deposited by ALD. In one example, the film 608 may be selected from the group consisting of a dielectric material, a metal, and a metal-containing material.

For example, the material of the film 608 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 608 may be selected from the group consisting of a metal oxide film, a metal nitride film, a metal oxynitride film, a metal silicate film, and a combination thereof. For example, the metal and the metal-containing material may be selected from the group consisting of Cu, Al, Ta, Ru, TaN, TaC, and TaCN.

In one example, the film 608 includes a metal oxide film that is deposited using ALD by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

In some examples, a thickness of the film 608 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 6C:
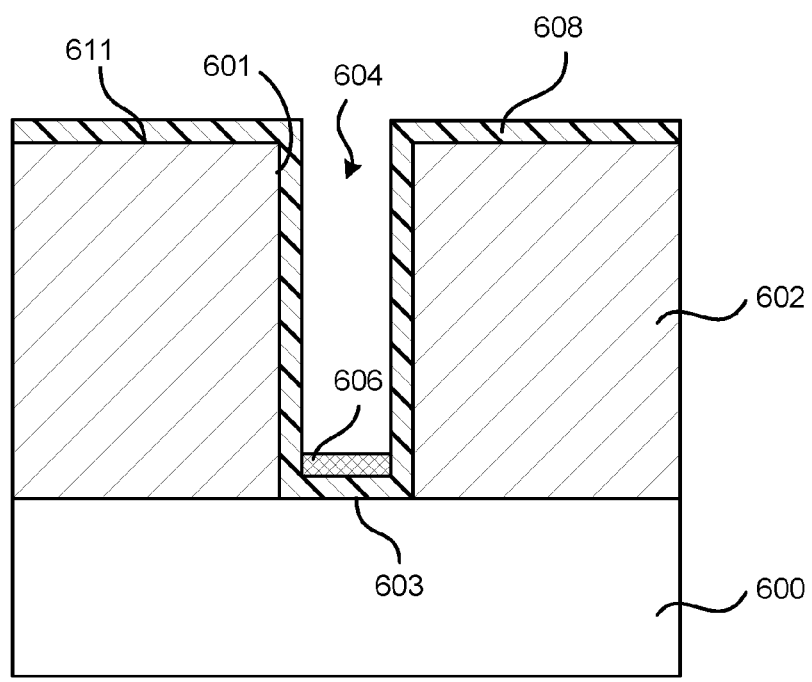

The process flow 5 further includes, in 504, covering the film 608 at the bottom 603 of the recessed feature 604 with a mask layer 606. This is depicted in FIG. 6C. The mask layer 606 can, for example, contain a photoresist, a hard mask, $SiO_2$, or SiN.

Figure 6D:
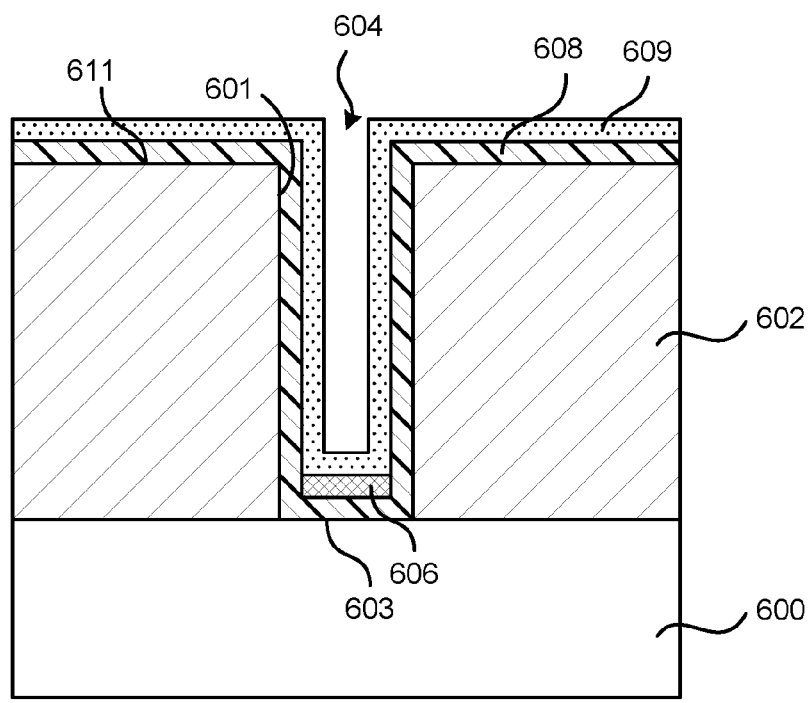
Figure 6E:
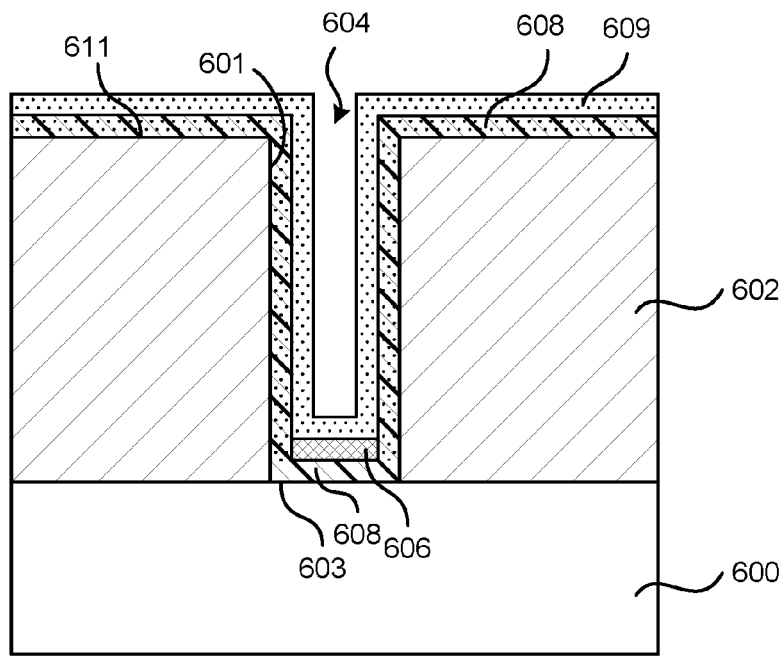

The process flow 5 further includes, in 506, depositing a dopant film 609 in the recessed feature 604. This is depicted in FIG. 6D. The dopant film 609 can include an oxide layer (e.g., $SiO_2$), a nitride layer (e.g., SiN), an oxynitride layer (e.g., SiON), or a combination of two or more thereof. The dopant film 609 can include one or more dopants from Group IIIA of the Periodic Table of the Elements: boron (B), aluminum (Al), gallium (Ga), indium (In), and thallium (Tl); and Group VA: nitrogen (N), phosphorous (P), arsenic (As), antimony (Sb), and bismuth (Bi). According to some embodiments, the dopant film 609 can contain low dopant levels, for example between about 0.5 and about 5 atomic % dopant. According to other embodiments, the dopant film 609 can contain medium dopant levels, for example between about 5 and about 20 atomic % dopant. According to yet other embodiments, the dopant film 609 can contain high dopant levels, for example greater than 20 atomic percent dopant.

The process flow 5 further includes, in 508, annealing the substrate to diffuse a dopant from the dopant film 609 into the film 608 on the sidewall 601 to activate the film 608 on the sidewall 601 for faster etching than the film 608 on the bottom 603 of the recessed feature 604. It is contemplated that the dopants disrupt the crystalline structure of the film 608, thereby enabling fast etching of the film 608 in a subsequent selective etching process.

Figure 6F:
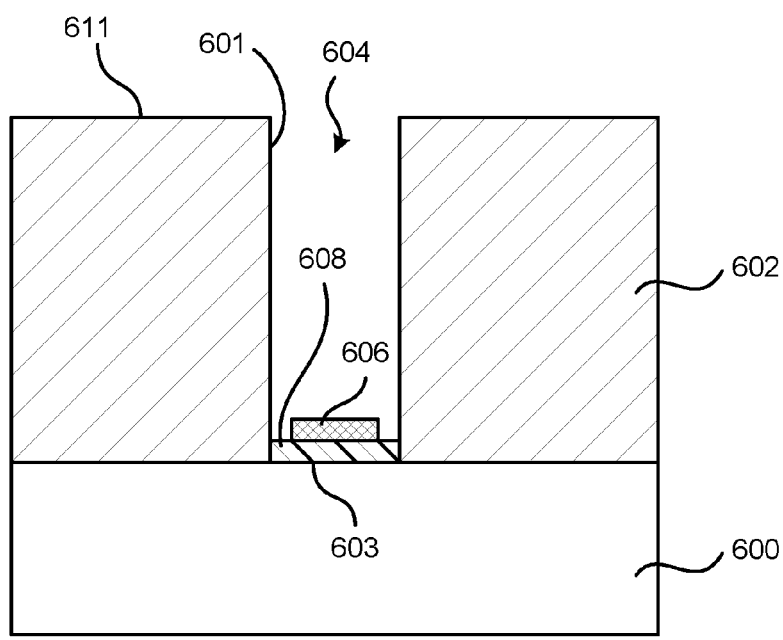

The process flow 5 further includes, in 510, etching the dopant film 609 and the film 608 from the sidewall 601 and the field area 611. As depicted in FIG. 6F, the etching removes the dopant film 609 and the film 608 from the sidewall 601 but the mask layer 606 protects the film 608 under the mask layer 606 from etching. The etch gases and the etch conditions may be selected for providing efficient removal of the dopant film 609 and the film 608 that is not protected by the mask layer 606. Step 510 may be performed in one or more etching steps using one or more etching recipes.

Figure 6G:
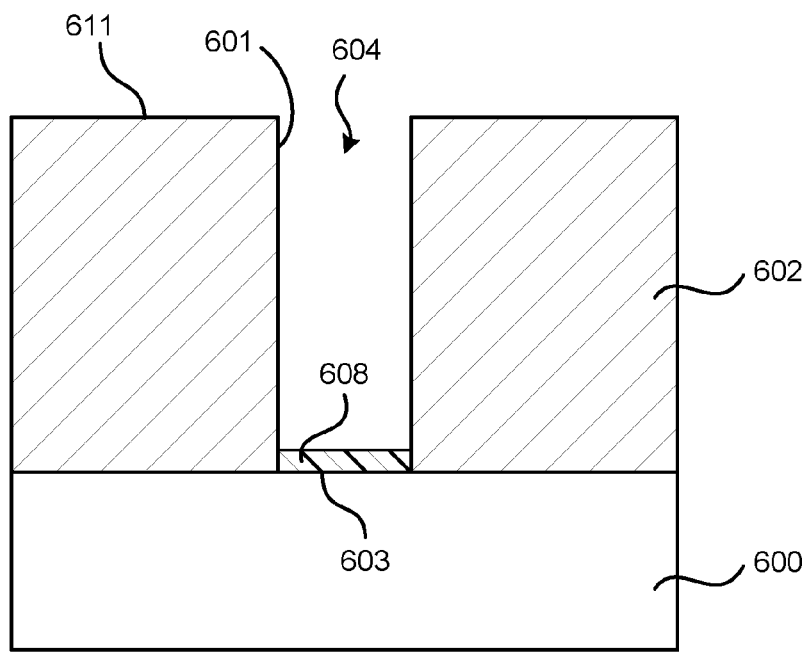

The process flow 5 further includes, in 512, removing the mask layer 606 from the film 608 on the bottom 603 of the recessed feature 604. This is depicted in FIG. 6G.

Figure 6H:
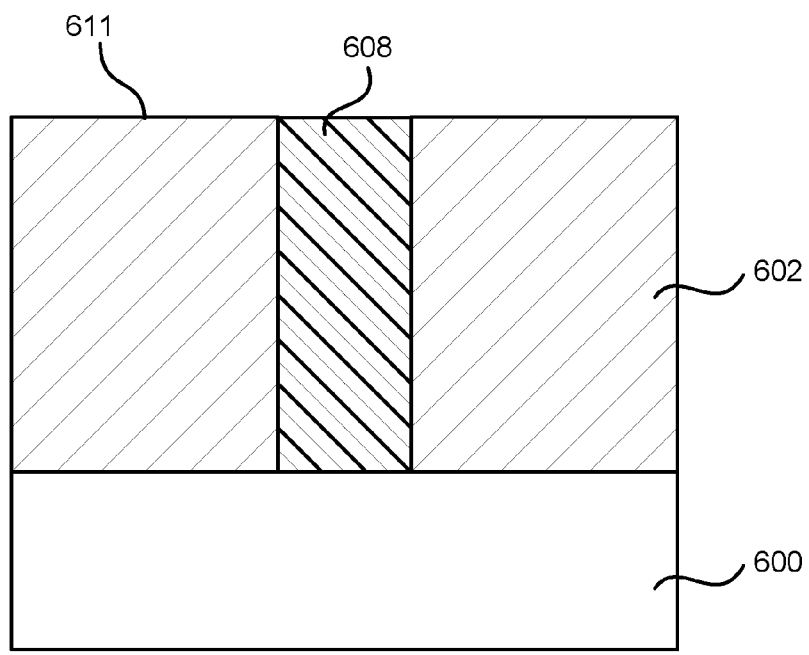

According to one embodiment of the invention, as shown by process arrow 514, steps 502-512 may be repeated until the film 608 has a desired thickness. In one example, as depicted in FIG. 6H, the recessed feature 604 may be filled with film 608.

A plurality of embodiments for bottom-up deposition of a film in a recessed feature have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A processing method, comprising:
    a) providing a substrate containing a recessed feature having a bottom and a sidewall;
    b) depositing a film on the bottom and on the sidewall;
    c) covering the film at the bottom with a mask layer;
    d) etching the film from the sidewall;
    e) removing the mask layer to expose the film at the bottom; and
    repeating steps b)-e) until the recessed feature is fully filled with the film.

2. The method of claim 1, wherein the bottom and the sidewall contain the same material.

3. The method of claim 2, wherein the material is selected from the group consisting of silicon, germanium, silicon germanium, a dielectric material, a metal, and a metal-containing material.

4. The method of claim 2, wherein the material is a dielectric material that is selected from the group consisting of $SiO_2$, SiON, SiN, a high-k material, a low-k material, and an ultra-low-k material.

5. The method of claim 2, wherein the material is a metal or a metal-containing material that are selected from the group consisting of Cu, Al, Ta, Ru, TaN, TaC, and TaCN.

6. The method of claim 1, wherein the bottom and the sidewall contain different materials.

7. A processing method, comprising:
    a) providing a substrate containing a recessed feature having a bottom and a sidewall;
    b) depositing a film on the bottom and on the sidewall of the recessed feature;
    c) treating the film with a gas phase plasma to activate the film on the sidewall for faster etching than the film on the bottom;
    d) etching the treated film from the sidewall; and
    repeating steps b)-d) until the recessed feature is fully filled with the film.

8. The method of claim 7, wherein the bottom and the sidewall contain the same material.

9. The method of claim 7, wherein the bottom and the sidewall contain different materials.

10. A processing method, comprising:
    a) providing a substrate containing a recessed feature having a bottom and a sidewall;
    b) depositing a film on the bottom and on the sidewall;
    c) covering the film at the bottom with a mask layer;
    d) depositing a dopant film in the recessed feature;
    e) annealing the substrate to diffuse a dopant from the dopant film into the film on the sidewall to activate the film on the sidewall for faster etching than the film on the bottom;
    f) etching the dopant film and the film from the sidewall; and
    g) removing the mask layer from the film on the bottom.

11. The method of claim 10, further comprising repeating steps b)-g) at least once until the film has a desired thickness in the recessed feature.

12. The method of claim 10, further comprising repeating steps b)-g) until the recessed feature is fully filled with the film.

13. The method of claim 10, wherein the bottom and the sidewall contain the same material.

14. The method of claim 10, wherein the bottom and the sidewall contain different materials.

15. The method of claim 10, wherein the dopant is selected from the group consisting of boron (B), aluminum (Al), gallium (Ga), indium (In), thallium (Tl), nitrogen (N), phosphorous (P), arsenic (As), antimony (Sb), and bismuth (Bi).

16. The method of claim 10, wherein the dopant film includes an oxide layer, a nitride layer, an oxynitride layer, or a combination thereof.

* * * * *